United States Patent
Kimura et al.

(10) Patent No.: US 7,867,794 B2
(45) Date of Patent: Jan. 11, 2011

(54) SURFACE-MOUNT TYPE OPTICAL SEMICONDUCTOR DEVICE AND METHOD FOR MANUFACTURING THE SAME

(75) Inventors: Mitsuyuki Kimura, Kyoto (JP); Kaoru Yamashita, Kyoto (JP); Hiroto Yamashita, Kyoto (JP); Tomoyuki Futakawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/718,503

(22) Filed: Mar. 5, 2010

(65) Prior Publication Data

US 2010/0159621 A1    Jun. 24, 2010

Related U.S. Application Data

(62) Division of application No. 11/910,334, filed as application No. PCT/JP2005/009992 on May 31, 2005, now Pat. No. 7,705,465.

(30) Foreign Application Priority Data

Apr. 1, 2005    (JP)    ............................. 2005-106682

(51) Int. Cl.
*H01L 21/00*    (2006.01)
*H01L 21/44*    (2006.01)
*H01L 21/48*    (2006.01)
*H01L 21/50*    (2006.01)
*H01L 33/00*    (2010.01)
*F21V 7/04*    (2006.01)

(52) U.S. Cl. ........................... 438/27; 438/65; 438/125; 362/555; 257/E23.129; 257/E31.127; 257/E33.056

(58) Field of Classification Search .................. 438/27, 438/65, 125; 362/507, 555; 257/E23.129, 257/E31.127, E33.056
See application file for complete search history.

(56) References Cited

U.S. PATENT DOCUMENTS 6,184,544 B1    2/2001    Toda et al.

(Continued)

FOREIGN PATENT DOCUMENTS

JP    6-338539    10/1994

(Continued)

*Primary Examiner*—David S Blum
(74) *Attorney, Agent, or Firm*—Hamre, Schumann, Mueller & Larson, P.C.

(57) ABSTRACT

A small and thin surface-mount type optical semiconductor device having high air tightness, which can be manufactured at a reduced cost includes: a base 2 formed of a glass substrate; a recess 5 formed on a first main surface 3 of the base; a through hole 7 extending from a bottom portion 4 of the recess to a second main surface 6 of the base; an inner wall conductive film formed on an inner wall surface of the through hole; a wiring pattern 9 made of a conductive film formed around an opening of the through hole on the bottom portion of the recess so as to be connected electrically to the inner wall conductive film; an optical semiconductor element 8 bonded to the wiring pattern via a conductive bonding material 14; a terminal portion 10 made of a conductive film formed around an opening of the through hole on the second main surface such that it is connected electrically to the inner wall conductive film; and a metal portion 13 bonded to the inner wall conductive film to clog the through hole.

2 Claims, 4 Drawing Sheets

U.S. PATENT DOCUMENTS

| | | |
|---|---|---|
| 6,593,598 B2 | 7/2003 | Ishinaga |
| 7,128,454 B2 | 10/2006 | Kim et al. |
| 7,129,576 B2 | 10/2006 | Humpston |
| 2004/0173808 A1 | 9/2004 | Wu |
| 2004/0190304 A1 | 9/2004 | Sugimoto et al. |

FOREIGN PATENT DOCUMENTS

| | | |
|---|---|---|
| JP | 11-008414 | 1/1999 |
| JP | 2000-216439 | 8/2000 |
| JP | 2002-319710 | 10/2002 |
| JP | 2003-037298 | 2/2003 |
| JP | 2004-228413 | 8/2004 |
| JP | 2005-019609 | 1/2005 | large
SURFACE-MOUNT TYPE OPTICAL SEMICONDUCTOR DEVICE AND METHOD FOR MANUFACTURING THE SAME This application is a division of U.S. Ser. No. 11/910,334, filed Oct. 1, 2007, now U.S. Pat. No. 7,705,465 which is a U.S. National Stage of PCT/JP2005/009992, filed May 31, 2005, which applications are incorporated herein by reference.

TECHNICAL FIELD

The present invention relates to a surface-mount type optical semiconductor device in which a light-receiving or emitting element is housed in a recess formed in a base to form a package.

BACKGROUND ART

As a conventional surface-mount type optical semiconductor device, a surface-mount type light-emitting diode is known in which a wiring pattern having a terminal portion is formed on a package base, and a light-emitting element is bonded face down on the wiring pattern (see, for example, Patent Document 1). FIG. 5 shows a surface-mount type light-emitting diode 101 described in Patent Document 1.

In FIG. 5, reference numeral 102 indicates a base formed of a ceramic material made of alumina, aluminum nitride, boron nitride or the like. On one surface of the base 102, a wiring pattern 103 is formed by etching a copper foil. On the other surface of the base 102, a terminal portion 104, onto which a mounting circuit board (not shown) is to be attached, is formed by plating with a conductive material, printing/baking of a conductive material, or the like. The wiring pattern 103 and the terminal portion 104 are connected electrically to each other. Onto the upper surface of the base 102, a lamp-house 105 surrounding the wiring pattern 103 is bonded, forming a recess 106.

On the wiring pattern 103 of the base 102 configured as above, bumps 107 are formed with gold, solder or the like. By bonding the bumps 107 to the electrode pads of a light-emitting element 108 by ultrasonic welding, the light-emitting element 108 is mounted. After the light-emitting element 108 is mounted, the recess 106 is filled with a transparent resin 109, which is then cured by heating. Thus, a surface-mount type light-emitting diode is formed.

Patent Document 1: JP 2003-37298A

DISCLOSURE OF INVENTION

Problem to be Solved by the Invention

However, according to the conventional configuration described above, because the ceramic material that forms the base 102 has grain boundaries where alumina particles having a size of at least 0.7 μm aggregate, if the thickness of the base 102 is reduced to 150 μm or less, a problem arises in maintaining the air tightness. Moreover, the thickness reduction causes the ceramic substrate to be bent after baking, resulting in poor processability and the problem that it is difficult to be mounted onto a mounting circuit board.

The present invention is intended to solve the problems encountered with conventional technology, and it is an object of the present invention to provide a small and thin surface-mount type optical semiconductor device having high air tightness, which can be manufactured at a reduced cost.

Means for Solving Problem

In order to solve the above problems encountered with conventional technology, a surface-mount type optical semiconductor device according to the present invention includes: a base formed of a glass substrate; a recess formed on a first main surface of the base; a through hole that extends from a bottom portion of the recess to a second main surface of the base; an inner wall conductive film that is formed on an inner wall surface of the through hole; a wiring pattern that is made of a conductive film formed around an opening of the through hole on the bottom portion of the recess so as to be connected electrically to the inner wall conductive film; an optical semiconductor element that is bonded to the wiring pattern via a conductive bonding material; a terminal portion that is made of a conductive film formed around an opening of the through hole on the second main surface such that it is electrically connected to the inner wall conductive film; and a metal portion that is bonded to the inner wall conductive film to clog the through hole.

Also, a method for manufacturing a surface-mount type optical semiconductor device according to the present invention includes the steps of forming a recess on a first main surface of a glass substrate; forming a through hole that extends from a bottom portion of the recess to a second main surface of the glass substrate; forming conductive films on an inner wall of the through hole, around an opening of the through hole on the first main surface, and around an opening of the same on the second main surface; filling a metal portion into the through hole and bonding the metal portion to the conductive film; and bonding an optical semiconductor element to the conductive film that is formed on the first main surface via a conductive bonding material.

Effects of the Invention

According to the surface-mount type optical semiconductor device configured as described above, it is possible to obtain a small and thin structure having high air tightness, which is free from warp, as well as to achieve excellent characteristics, that is, excellent processability and excellent mountability to mounting circuit boards.

Further, according to the manufacturing method described above, it is possible to manufacture a small and thin surface-mount type optical semiconductor device at a low cost, which has not been achieved using ceramics.

DESCRIPTION OF REFERENCE NUMERALS

Figure 1A:
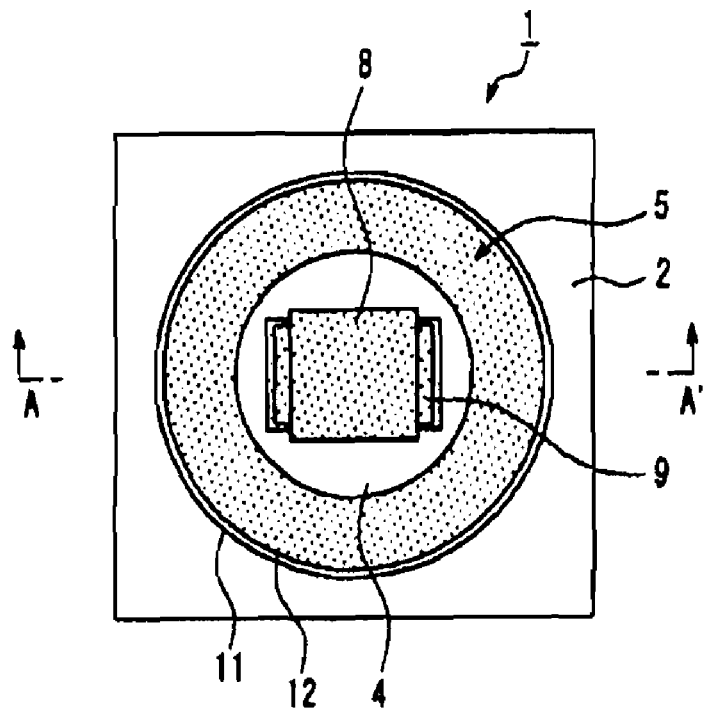
FIG. 1A is a plan view of a surface-mount type light-emitting diode according to Embodiment 1 of the present invention.

1 Surface-mount type light-emitting diode
2 Base
3 First main surface
4 Flat portion
5 Recess
6 Second main surface
7 Through hole
7a Conductive film
8 Light-emitting element
9 Wiring pattern
10 Terminal portion
11 Radial wall
12 Reflective film
13 Metal portion
14 Bump
15 Light transmissive resin
16 Glass substrate
17 Conductive pattern
18 Through hole
19 Metal portion
22 Light transmissive lid
101 Surface-mount type semiconductor device
102 Base
103 Wiring pattern
104 Terminal
105 Lamphouse
106 Recess
107 Bump
108 Light-emitting element
109 Transparent resin

DESCRIPTION OF THE INVENTION

In the surface-mount type optical semiconductor device according to the present invention, it is preferable that the wall surface of the recess forms a radial wall that extends radially from the bottom toward the surface, and a reflective film is formed on the radial wall such that it is insulated from the wiring pattern.

It is also preferable that, in the through hole, the opening on the second main surface has a larger area than the opening on the bottom portion of the recess. This increases the area of the metal portion that is exposed at the second main surface, increasing heat dissipation.

It is also preferable that the recess is filled with a light transmissive resin. Thereby, the optical semiconductor element and the portion on which the optical semiconductor element is mounted are protected, and therefore stable characteristics can be maintained. Instead of the structure in which the recess is filled with a light transmissive resin, it is also possible to employ a structure in which a light transmissive lid covering the recess is fixed on the first main surface.

In the method for manufacturing a surface-mount type optical semiconductor device of the present invention, it is preferable that the step of filling a metal portion into the through hole is performed such that a spherical-tipped wire formed at the tip of a capillary tool is filled into the through hole, and welded by an ultrasonic thermocompression bonding method. Thereby, the conductive film formed in the through hole and the spherical metal material formed by a wire bonder can be bonded at a high speed with high precision by an ultrasonic thermocompression bonding method using a wire bonder.

Hereinafter, embodiments of the present invention will be described in further detail with reference to the accompanying drawings.

Embodiment 1

Figure 1B:
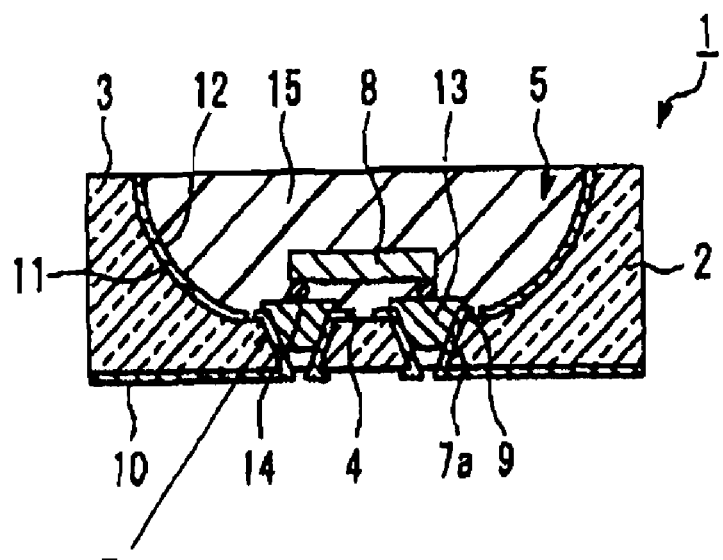
FIG. 1B is a cross sectional view taken along the line A-A' of FIG. 1A.

FIG. 1A is a plan view of a light-emitting diode 1 as a surface-mount type optical semiconductor device of Embodiment 1. FIG. 1B is a cross sectional view taken along the line A-A' of FIG. 1A.

A base 2 shown in FIGS. 1A and 1B is formed of a glass substrate made of borosilicate glass or alkali-free glass having a linear expansion coefficient of $30 \times 10^{-7}/°$ C. to $80 \times 10^{-7}/°$ C., or of soda glass having a linear expansion coefficient of $80 \times 10^{-7}/°$ C. to $120 \times 10^{-7}/°$ C. In this embodiment, the thickness of the glass substrate can be set to, for example, 0.15 mm.

On the first main surface 3 of the base 2, a recess 5 having a flat portion 4 at the bottom is formed. At least two through holes 7 that extend through the base 2 to the second main surface 6 of the base 2 are formed in the flat portion 4. A wiring pattern 9 made of a conductive film, onto which a light-emitting element 8 is to be mounted, is formed around the openings of the through holes 7 on the first main surface 3. A terminal portion 10 made of a conductive film, to which an external circuit (not shown) is to be connected, is formed around the openings of the through holes 7 on the second main surface 6.

The recess 5 can be formed by, for example, subjecting the flat glass substrate to a blasting process. Alternatively, a method can be employed in which a recess 5 is formed concurrently with the molding of the glass substrate. The recess 5 has a shape that extends radially outward from the bottom toward the upper surface. A reflective film 12 made of silver, rhodium, aluminum or the like is formed on a radial wall 11, which extends radially outward from the bottom, by a vapor deposition method, sputtering method or the like, such that the reflective film 12 is insulated from the conductive film that forms the wiring pattern 9.

The through holes 7 are formed such that the diameter of the inner wall decreases gradually from the first main surface 3 to the second main surface 6. As an example, the diameter of the through holes 7 is set to 120 μm on the first main surface 3 side, and 80 μm on the second main surface 6 side.

On the inner wall of the through holes 7, a conductive film 7a is formed, whereby the wiring pattern 9 and the terminal portion 10 are connected electrically to each other. Also, a metal portion 13 for clogging the opening on the first main surface 3 side is formed, and bonded to the conductive film. The conductive film has, for example, a configuration in which a film of chromium or titanium having a thickness not less than 0.05 μm and not greater than 0.1 μm is formed on the glass surface of the base 2 by a sputtering method, a film of palladium is formed thereon, and a film of gold is formed on the uppermost surface. According to this configuration of the conductive film, the chromium or titanium film has excellent adherence to the glass, the palladium film functions as a barrier metal, and the gold film is effective for corrosion resistance and adherence to the metal.

On the wiring pattern 9, bumps 14 are formed with gold, solder or the like, and the electrode pads (not shown) of a light-emitting element 8 and the bumps 14 are ultrasonically welded. Further, in order to protect the light-emitting element 8-mounting portion, the recess 5 of the base 2 is filled with a liquid light transmissive resin such as an epoxy resin or silicon resin, which then is cured by heating, thereby forming a layer of the light transmissive resin 15. Thus, a surface-mount type light-emitting diode 1 package is formed.

According to the above-described configuration, because the conductive films 7a formed in the through holes 7 are bonded to the metal portions 13, the through holes 7 have high air tightness.

It should be noted that, in this embodiment, the light transmissive resin 15 is used for the purpose of protecting the light-emitting element 8-mounting portion, but it is also possible to change the color tone of light by mixing the light transmissive resin with a fluorescent material.

Further, instead of using the light transmissive resin 15, it is also possible to form a package having excellent air tightness by covering the recess with a preformed lens that is made of glass or a light transmissive resin, followed by bonding.

Alternatively, by using a glass substrate having increased light transmissivity as the base 2, and appropriately designing the shape of the recess 5 without forming the reflective film 12, it is possible to ensure a wide directional angle, increasing the amount of light received by a light-receiving element such as a photodiode, phototransistor or photo IC.

Embodiment 2

Figure 2A:
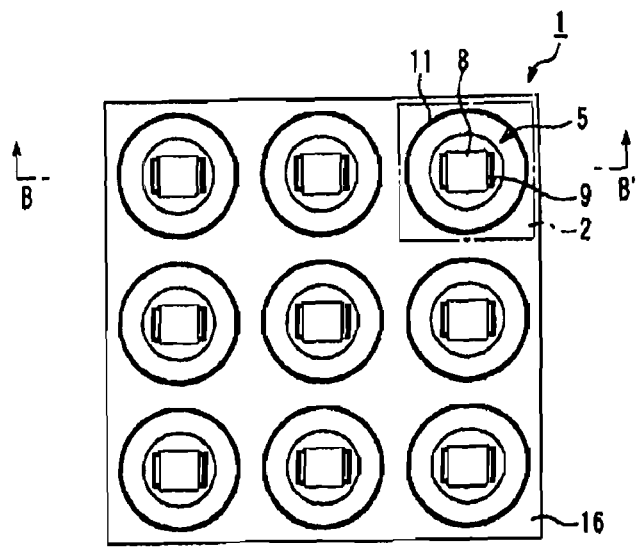
FIG. 2A is a plan view of a surface-mount type light-emitting diode device according to Embodiment 2 of the present invention.
Figure 2B:
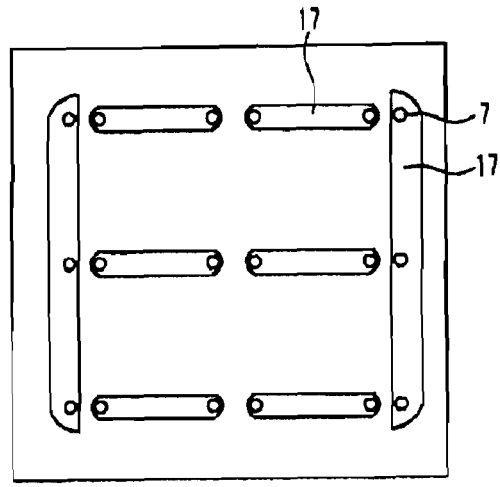
FIG. 2B is an underside view of the surface-mount type light-emitting diode device of FIG. 2A.
Figure 2C:
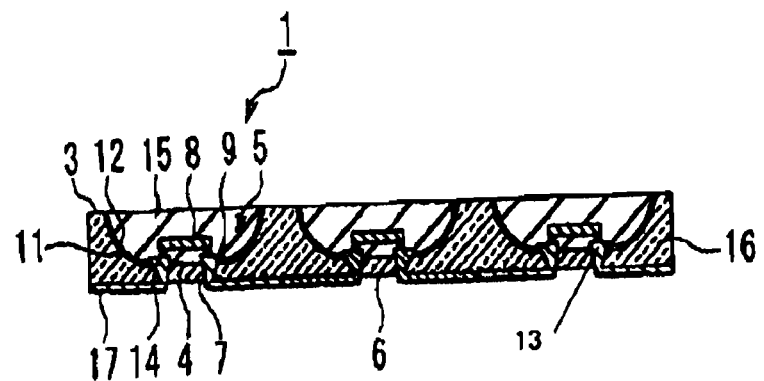
FIG. 2C is a cross sectional view taken along the line B-B' of FIG. 2A.

FIGS. 2A to 2C show a surface-mount type light-emitting diode device according to Embodiment 2. This device is configured such that a plurality of surface-mount type light-emitting diodes 1, each having a light-emitting element 8, are arranged in an array. FIG. 2A shows a plan view, FIG. 2B shows an underside view, and FIG. 2C shows a cross sectional view taken along the line B-B' of FIG. 2A. In FIGS. 2A to 2C, the same reference numerals are given to the same components as those of FIG. 1, and the description thereof is omitted.

In the surface-mount type light-emitting diode device shown in FIGS. 2A to 2C, a sheet-like glass substrate 16 is used, and a plurality of bases 2, which are the same as that shown in FIGS. 1A and 1B, are formed. Specifically, recesses 5 having a flat portion 4 at the bottom are formed on the first main surface 3, and at least two through holes 7 that extend to the second main surface 6 of the base 2 are formed in the bottom flat portion 4 of each recess 5. A wiring pattern 9 made of a conductive film, onto which a light-emitting element 8 is to be mounted, is formed around the openings of the through holes 7 on the first main surface 3. A terminal portion 17 made of a conductive film, to which an external circuit (not shown) is to be connected, is formed around the openings of the through holes 7 on the second main surface 6. The terminal portions 17 form a conductive pattern that electrically connects across the bases 2 on the second main surface 6, and has a function of connecting to an external circuit (not shown) as well as a function of connecting the plurality of surface-mount type light-emitting diodes 1 in an array.

In the through holes 7, conductive films are formed on the inner walls thereof, whereby the wiring pattern 9 and the terminal portion 17 are connected electrically. Metal portions 13 are also formed, which bond the openings on the first main surface 3 and the conductive films.

On the wiring pattern 9, bumps 14 are formed with gold, solder or the like, and the electrode pads of a light-emitting element 8 and the bumps 14 are ultrasonically welded. Further, the recesses 5 of the bases 2 are filled with a light transmissive resin 15, followed by curing by heating. Thus, a surface-mount type light-emitting diode device is formed. According to this configuration, because a plurality of bases 2 are formed on a sheet-like glass substrate 16, size reduction can be achieved while integrating a large number of light-emitting diodes Embodiment 3

FIGS. 3A to 3E are cross-sectional views illustrating the process flow of a method for manufacturing a surface-mount type optical semiconductor device according to Embodiment 3. In FIGS. 3A to 3E, the same reference numerals are given to the same components as those shown in FIGS. 1A and 1B, and the description thereof is omitted.

Figure 3A:
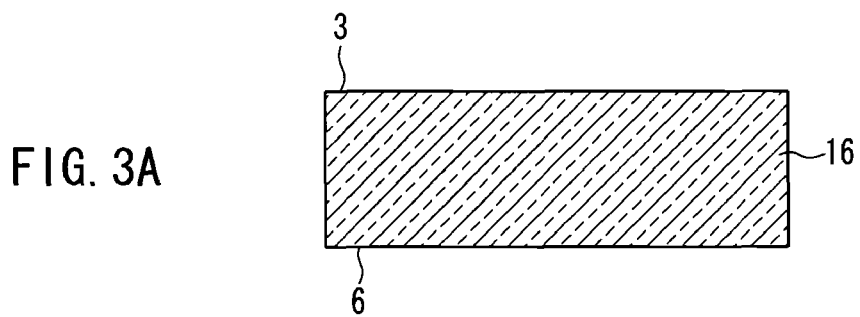
FIG. 3A is a cross sectional view illustrating the process flow of a method for manufacturing a surface-mount type optical semiconductor device according to Embodiment 3 of the present invention.

First, as shown in FIG. 3A, as a glass substrate 16 for forming a base 2, an alkali-free glass substrate made of a material such as borosilicate glass, alkali-free glass or soda glass, which provide high insulation and air tightness, having a thickness of about 0.15 mm is prepared.

Figure 3B:
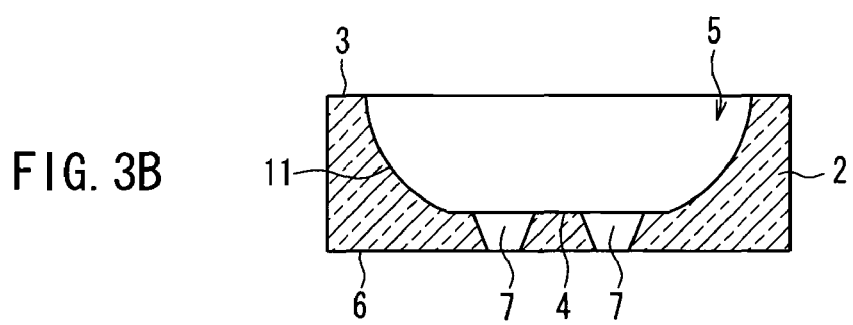
FIG. 3B is a cross sectional view illustrating a step subsequent to that of FIG. 3A.

Subsequently, the first main surface 3 of the glass substrate 16 is sandblasted, etched or the like to form a recess 5 having a flat portion 4 at the bottom as shown in FIG. 3B. Then, at least two through holes 7 that extend to the second main surface 6 of the base 2 are formed in the flat portion 4. The recess 5 has a shape that extends radially outward from the bottom toward the surface.

Figure 3C:
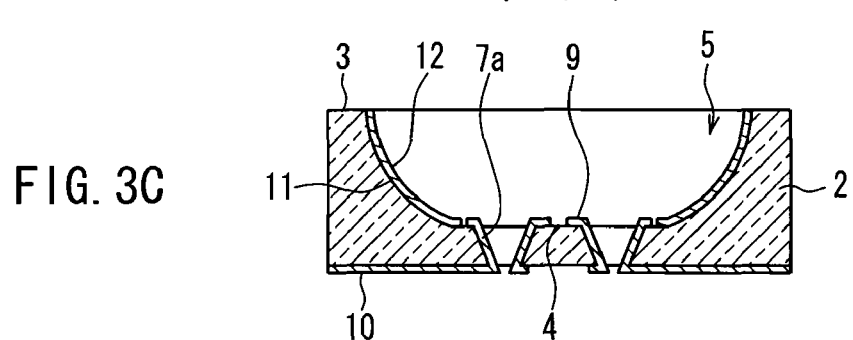
FIG. 3C is a cross sectional view illustrating a step subsequent to that of FIG. 3A.

Subsequently, as shown in FIG. 3C, on the radial wall 11 of the recess 5 that extends radially, a reflective film 12 made of silver, rhodium, aluminum or the like is formed by a vapor deposition method, sputtering method or the like. Further, a wiring pattern 9 made of a conductive film, onto which a light-emitting element 8 is to be mounted, is formed around the openings of the through holes 7 on the first main surface 3. Likewise, a terminal portion 10 made of a conductive film, to which an external circuit (not shown) is to be connected, is formed around the openings of the through holes 7 on the second main surface 6. The wiring pattern 9 and the terminal portion 10 are connected electrically to each other by the conductive films 7a in the through holes 7. The conductive film is formed by, for example, forming a 0.1 μm thick film of chromium on the alkali-free glass by a sputtering method, forming a 0.05 μm thick film of palladium thereon, and applying a 0.5 μm thick gold coating by electrolytic gold plating.

By using a glass substrate 16 having increased light transmissivity, and appropriately designing the shape of the recess 5 without forming the reflective film 12, it is possible to ensure a wide directional angle, increasing the amount of light received by a light-receiving element such as a photodiode, phototransistor or photo IC.

Figure 3D:
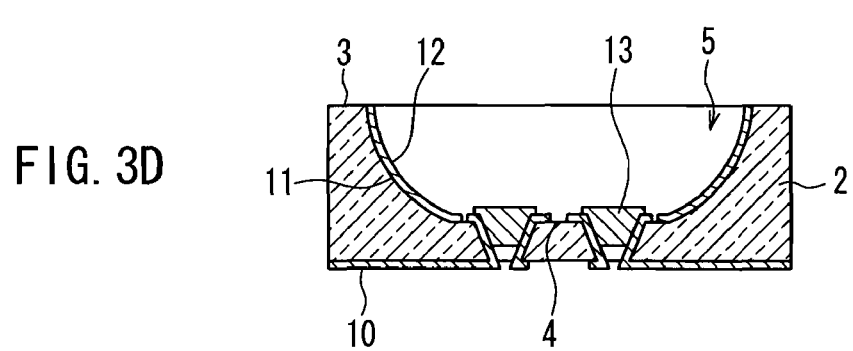
FIG. 3D is a cross sectional view illustrating a step subsequent to that of FIG. 3A.

Subsequently, as shown in FIG. 3D, metal portions 13 that connect the periphery of the openings of the through holes 7 on the first main surface 3 and the conductive films 7a are formed. As the method for forming the metal portions 13, a method that uses a ball bonder can be used. Specifically, a metal portion 13 is formed as follows. A through hole 7 has a diameter of 100 μm to 150 μm, and a shape in which the diameter of the inner wall decreases gradually from the first main surface 3 toward the second main surface 6. The size of the through hole 7 is selected as appropriate according to the size and material of the metal wire to be bonded and the bonding method.

A vertically movable capillary tool (not shown) is arranged above the base 2 and aligned to the through hole 7. A metal wire is inserted into the center of this capillary tool, and its tip is formed to have a substantially hemispherical shape. The material of the metal wire can be selected from gold, copper and the like, and can be selected as appropriate according to the material of the conductive film formed on the base, or the like. Here, a case is described in which a metal wire composed mainly of gold is used. This metal wire has a diameter of, for example, 25 μm to 50 μm. Gold wires provide high corrosion resistance and are effective in bonding to all materials for the conductive film With the settings as described above, the tip of the metal wire is heated and melted by a torch (not shown) to form a ball portion. Because the diameter of this ball portion is about three to four times larger than that of the metal wire, in the case of using a gold wire having a diameter of 38 μm, the ball portion will have a diameter of about 120 μm. The ball portion can be formed also by a spark discharge generated between the tip of the metal wire and an other potential point.

Subsequently, the ball portion is pressed down onto the through hole 7 of the base 2 that is heated to 150 to 350° C. with ultrasonic vibrations applied in the Y direction and slight mechanical vibrations applied in the X direction while the capillary tool is moving downward. Thereafter, the capillary tool is moved upward, and the metal wire is cut off to have an appropriate length. In this cutting process of the metal wire, for example, when the metal wire is heated, melted and cut off by a torch (not shown), the workability in continuous manufacturing of the base 2 can be improved, because a ball portion is formed at the cut-off portion.

Upon filling of the ball portion formed by forming the tip of the metal wire into a hemispherical shape as described above into the through hole 7, the ball portion is bonded to the conductive film 7a formed on the inner wall of the through hole 7, forming a metal portion 13 for establishing an electrical connection. Thus, the air tightness of the through hole 7 is improved significantly as compared to conventional technology, and the air tightness is kept in a stable manner.

Figure 3E:
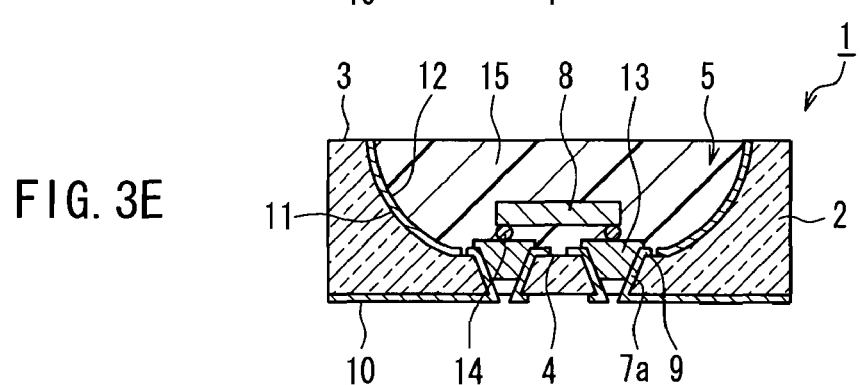
FIG. 3E is a cross sectional view illustrating a step subsequent to that of FIG. 3A.

Subsequently, as shown in FIG. 3E, bumps 14 are formed with gold, solder or the like on the wiring pattern 9 on the first surface 3 of the base 2, which then are ultrasonically welded to the electrode pads of a light-emitting element 8. Thereby, the terminal portion 10 formed on the second main surface 6 of the base 2 is connected electrically to the light-emitting element 8 via the conductive films 7a formed on the inner walls of the through holes 7, the wiring pattern 9 and the bumps 14.

Finally, the recess 5 in which the light-emitting element 8 is mounted is filled with a liquid light transmissive resin such as an epoxy resin, silicon resin or the like, followed by curing to form a layer of the light transmissive resin 15. Thus, a surface-mount type light-emitting diode package is obtained.

Embodiment 4

Figure 4:
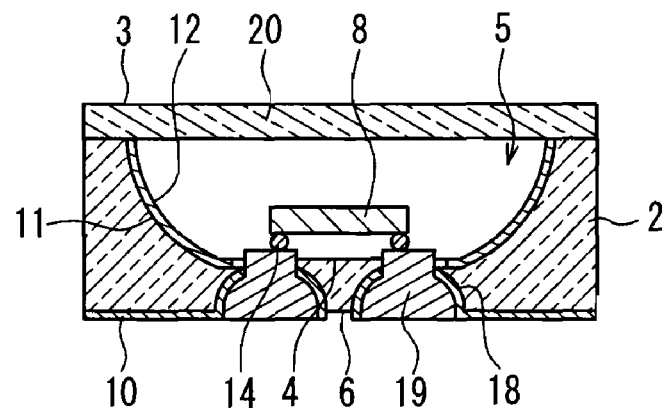
FIG. 4 is a cross sectional view of a surface-mount type light-emitting diode according to Embodiment 4 of the present invention.
Figure 5:
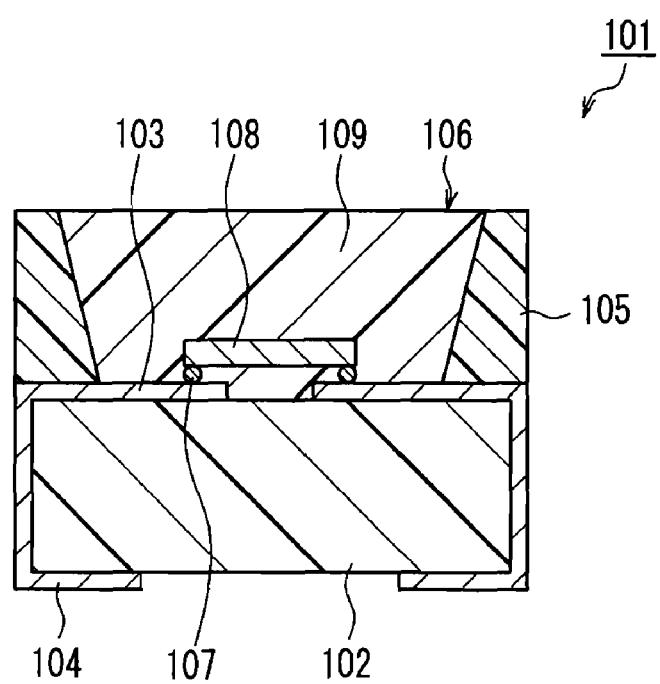
FIG. 5 is a cross sectional view of a conventional surface-mount type light-emitting diode.

A light-emitting diode as a surface-mount type optical semiconductor device according to Embodiment 4 of the present invention will be described with reference to the cross sectional view of FIG. 4. This light-emitting diode has a basic structure similar to the structure of Embodiment 1 shown in FIG. 1. The difference from the structure of Embodiment 1 lies in the shape of the through holes 18 and the shape of the metal portions 19 formed in the through holes 18.

In a through hole 18, the opening positioned on the second main surface 6 has a larger area than the opening positioned on the bottom portion 4 of the recess 5. This increases the area of the metal portion 19 that is exposed at the second main surface 6, increasing heat dissipation. For this reason, the metal portion 19 preferably is formed using a metal material having excellent heat conductivity. As the method for filling the metal material, besides the method described in the above embodiment, electroforming, the application of a conductive paste or the like can be used.

Further, in this embodiment, instead of using the structure in which the recess 5 is filled with the light transmissive resin, a flat plate-like light transmissive lid 20 is fixed on the first main surface 3 to cover the recess 5. As the light transmissive lid 20, a preform, such as a lens, made of glass or a light transmissive resin can be used.

INDUSTRIAL APPLICABILITY

According to the present invention, it is possible to configure a small and thin package having excellent air tightness, in which a light-emitting element, a light-receiving element or the like is mounted. The present invention is useful in a surface-mount type light-emitting diode or an array-type surface-mount type light-emitting diode device.

The invention claimed is:

1. A method for manufacturing a surface-mount type optical semiconductor device comprising the steps of:
   forming a recess on a first main surface of a glass substrate;
   forming a through hole that extends from a bottom portion of the recess to a second main surface of the glass substrate;
   forming a conductive film on an inner wall of the through hole, and around openings of the through hole on the first main surface and the second main surface;
   filling a metal portion into the through hole and bonding the metal portion to the conductive film; and
   bonding an optical semiconductor element to the conductive film that is formed on the first main surface via a conductive bonding material.

2. The method for manufacturing a surface-mount type optical semiconductor device according to claim 1,
   wherein the step of filling a metal portion into the through hole is performed such that a spherical-tipped wire formed at the tip of a capillary tool is filled into the through hole, and welded by an ultrasonic thermocompression bonding method.

* * * * *